(12) United States Patent
Chiang et al.

(10) Patent No.: US 11,812,663 B2
(45) Date of Patent: Nov. 7, 2023

(54) METHOD FOR MANUFACTURING FLEXIBLE THERMOELECTRIC STRUCTURE

(71) Applicant: INDUSTRIAL TECHNOLOGY RESEARCH INSTITUTE, Hsinchu (TW)

(72) Inventors: Ying-Jung Chiang, Hsinchu (TW); Ren-Der Jean, Hsinchu (TW); Hong-Ching Lin, Kaohsiung (TW); Hsu-Shen Chu, Hsinchu (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 851 days.

(21) Appl. No.: 16/862,724

(22) Filed: Apr. 30, 2020

(65) Prior Publication Data

US 2020/0259063 A1 Aug. 13, 2020

Related U.S. Application Data

(62) Division of application No. 15/394,190, filed on Dec. 29, 2016, now abandoned.

(30) Foreign Application Priority Data

Dec. 6, 2016 (TW) .................. 105140214

(51) Int. Cl.
*H10N 10/17* (2023.01)
*H10N 10/01* (2023.01)
(Continued)

(52) U.S. Cl.
CPC ............. *H10N 10/17* (2023.02); *H10N 10/01* (2023.02); *H10N 10/852* (2023.02);
(Continued)

(58) Field of Classification Search
CPC ...... H10N 10/853; H10N 10/85; H10N 10/01; H10N 10/80; H10N 10/851; H10N 10/852;
(Continued)

(56) References Cited

U.S. PATENT DOCUMENTS 5,040,381 A 8/1991 Hazen
6,348,650 B1 2/2002 Endo et al.
(Continued)

FOREIGN PATENT DOCUMENTS

CN 1855373 A 11/2006
CN 101154643 A 4/2008
(Continued)

OTHER PUBLICATIONS

Chinese Office Action and Search Report dated Sep. 15, 2020 for Application No. 201611216706.7.
(Continued)

*Primary Examiner* — Michael Y Sun
(74) *Attorney, Agent, or Firm* — Birch, Stewart, Kolasch & Birch, LLP

(57) ABSTRACT

A flexible thermoelectric structure is provided, which includes a porous thermoelectric pattern having a first surface and a second surface opposite to the first surface, and a polymer film covering the first surface of the porous thermoelectric pattern. The polymer film fills pores of the porous thermoelectric pattern. The polymer film has a first surface and a second surface opposite to the first surface. The second surface of the polymer film is coplanar with the second surface of the porous thermoelectric pattern.

6 Claims, 3 Drawing Sheets

(51) Int. Cl.
  *H10N 10/852* (2023.01)
  *H10N 10/853* (2023.01)
  *H10N 10/857* (2023.01)
  *H10N 10/85* (2023.01)
  *H10N 10/00* (2023.01)

(52) U.S. Cl.
  CPC ......... *H10N 10/853* (2023.02); *H10N 10/857* (2023.02); *H10N 10/00* (2023.02); *H10N 10/85* (2023.02)

(58) Field of Classification Search
  CPC ...... H10N 10/17; H10N 10/857; H10N 10/00; H05B 3/36; H05K 3/28; H05K 2203/1377
  See application file for complete search history.

(56) References Cited

U.S. PATENT DOCUMENTS

| | | |
|---|---|---|
| 7,135,394 B2 | 11/2006 | Houng et al. |
| 7,763,791 B2 | 7/2010 | Feng et al. |
| 7,821,136 B2 | 10/2010 | Houng et al. |
| 8,465,677 B2 | 6/2013 | Lu et al. |
| 8,829,327 B2 | 9/2014 | Meng et al. |
| 8,911,821 B2 | 12/2014 | Lu et al. |
| 8,956,905 B2 | 2/2015 | Petkie |
| 9,082,930 B1 * | 7/2015 | Wacker ................. H10N 10/17 |
| 9,353,445 B2 | 5/2016 | Petkie |
| 2008/0173344 A1 | 7/2008 | Zhang et al. |
| 2012/0018682 A1 | 1/2012 | Minami et al. |
| 2013/0218241 A1 | 8/2013 | Savoy et al. |
| 2014/0060601 A1 | 3/2014 | Gotsmann et al. |
| 2014/0060607 A1 | 3/2014 | Wu et al. |
| 2014/0097002 A1 | 4/2014 | Sachs et al. |
| 2014/0318414 A1 | 10/2014 | Chiou et al. |
| 2015/0048283 A1 | 2/2015 | Kato et al. |
| 2015/0130012 A1 | 5/2015 | Jun et al. |
| 2015/0245470 A1 | 8/2015 | Su et al. |
| 2015/0342523 A1 | 12/2015 | Baik et al. |
| 2016/0017570 A1 | 1/2016 | Miyamoto et al. |
| 2016/0056360 A1 | 2/2016 | Cho et al. |
| 2016/0172570 A1 | 6/2016 | Wright et al. |

FOREIGN PATENT DOCUMENTS

| | | |
|---|---|---|
| CN | 101376989 A | 3/2009 |
| CN | 101384425 A | 3/2009 |
| CN | 101798683 A | 8/2010 |
| CN | 101908388 A | 12/2010 |
| CN | 102544348 A | 7/2012 |
| CN | 102555323 A | 7/2012 |
| CN | 203288656 U | 11/2013 |
| CN | 103459549 A | 12/2013 |
| CN | 103491659 A | 1/2014 |
| CN | 203490670 U | 3/2014 |
| CN | 103872236 A | 6/2014 |
| CN | 104064516 A | 9/2014 |
| CN | 104205250 A | 12/2014 |
| CN | 104247063 A | 12/2014 |
| CN | 104465977 A | 3/2015 |
| CN | 104869754 A | 8/2015 |
| CN | 105320313 A | 2/2016 |
| JP | 6-84604 A | 3/1994 |
| JP | 2015-162678 A | 9/2015 |
| TW | I243004 B | 11/2005 |
| TW | 201126779 A1 | 8/2011 |
| TW | I383950 B1 | 2/2013 |
| TW | 201347249 A | 11/2013 |
| TW | I423930 B | 1/2014 |
| TW | 201434629 A | 9/2014 |
| TW | 201442307 A | 11/2014 |
| TW | 201503431 A | 1/2015 |
| TW | I471072 B | 1/2015 |
| TW | 201521246 A | 6/2015 |
| TW | 201533937 A | 9/2015 |
| TW | 201534185 A | 9/2015 |
| TW | I538581 B | 6/2016 |
| WO | WO2014070611 * | 5/2014 |
| WO | WO2017082558 * | 5/2017 |

OTHER PUBLICATIONS

Cao et al., "Flexible screen printed thick film thermoelectric generator with reduced material resistivity," Journal of Physics: Conference Series 557, Dec. 16, 2014, pp. 1-5 (6 pages total).

Chen et al., "Dispenser Printed Thermoelectric Energy Generators," PowerMEMS Conference, Dec. 1-4, 2009, pp. 277-280.

Chen et al., "Dispenser-printed planar thick-film thermoelectric energy generators," Journal of Micromechanics and Microengineering, vol. 21, Sep. 29, 2011, pp. 1-8 (9 pages total).

Chinese Office Action and Search Report for Chinese Application No. 201611216706.7, dated Mar. 30, 2020.

Kim et al., "A wearable thermoelectric generator fabricated on a glass fabric," Energy & Environmental Science, vol. 7, Mar. 14, 2014, pp. 1959-1965.

Lee et al., "Thermoelectric properties of screen-printed ZnSb film," Thin Solid Films, vol. 519, 2011, pp. 5441-5443.

Madan et al., "Enhanced Performance of Dispenser Printed MA n-type Bi2Te3 Composite Thermoelectric Generators," Applied Materials & Interfaces, vol. 4, Nov. 7, 2012, pp. 6117-6124.

Taiwanese Office Action and Search Report, dated Jun. 5, 2017, for Taiwanese Application No. 105140214.

* cited by examiner

METHOD FOR MANUFACTURING FLEXIBLE THERMOELECTRIC STRUCTURE

CROSS REFERENCE TO RELATED APPLICATIONS

The present application is a Divisional of pending U.S. patent application Ser. No. 15/394,190, filed Dec. 29, 2016 and entitled "Flexible thermoelectric structure and method for manufacturing the same", which is based on, and claims priority from, Taiwan Application Serial Number 105140214, filed on Dec. 6, 2016, the disclosure of which is hereby incorporated by reference herein in its entirety.

TECHNICAL FIELD

The technical field relates to a method for manufacturing the same.

BACKGROUND

General low-temperature type thermoelectric materials (e.g. $Bi_2Te_3$-based material) are inherently brittle, and the surface of the thermoelectric material can easily become oxidized by coming into contact with air. A common thermoelectric pattern is formed by the following steps: mixing thermoelectric powder, curable resin, solvent, and other additives to form a printable thermoelectric ink, and then printing the ink on a flexible substrate. The printed thermoelectric pattern is bonded to the substrate by the curable and adhesive properties of the resin, and the thermoelectric powder is surrounded by the electrically insulated polymer resin. As such, this kind of printed thermoelectric pattern has flexibility, but it also has problems such as insufficient electrical conductivity and thermoelectric properties.

Accordingly, a novel method of manufacturing a thermoelectric pattern with flexibility, electrical conductivity, and thermoelectric properties is called for.

SUMMARY

One embodiment of the disclosure provides a flexible thermoelectric structure, comprising: a porous thermoelectric pattern having a first surface and a second surface opposite to the first surface; and a polymer film covering the first surface of the porous thermoelectric pattern, wherein the polymer film has a first surface and a second surface opposite to the first surface; wherein the polymer film fills pores of the porous thermoelectric pattern, and the second surface of the polymer film is coplanar with the second surface of the porous thermoelectric pattern.

One embodiment of the disclosure provides a method of manufacturing a flexible thermoelectric structure, comprising: forming a pattern of a thermoelectric ink on a substrate; thermal treating the thermoelectric ink to form a porous thermoelectric pattern on the substrate; coating a gel polymer on the porous thermoelectric pattern and the substrate, and curing the gel polymer to form a polymer film, wherein the porous thermoelectric pattern and the polymer film construct a flexible thermoelectric structure; and separating the substrate and the flexible thermoelectric structure, wherein the porous thermoelectric pattern has a first surface and a second surface opposite to the first surface; and wherein the polymer film has a first surface and a second surface opposite to the first surface; wherein the polymer film covers the first surface of the porous thermoelectric pattern and fills pores of the porous thermoelectric pattern, and the second surface of the polymer film is coplanar with a second surface of the porous thermoelectric pattern.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
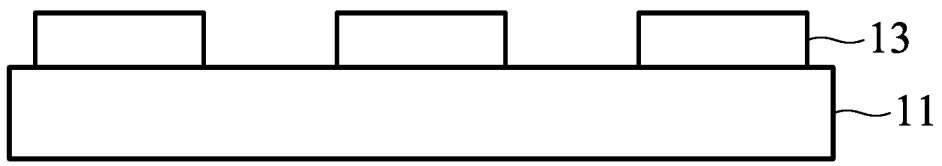
FIGS. 1 to 5 show a process of manufacturing a flexible thermoelectric structure in one embodiment of the disclosure.

In the following detailed description, for the purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

In one embodiment, a method of manufacturing a flexible thermoelectric structure is provided. First, a thermoelectric material, a binder, and a solvent are mixed to form a thermoelectric ink. In one embodiment, the thermoelectric material includes $Bi_2Te_3$-based material, PbTe-based material, GeTe-based material, $Zn_4Sb_3$-based material, $CoSb_3$-based material, or the like. For example, a p-type $Bi_2Te_3$-based material includes at least Bi or Sb, and at least Te or Se. For example, an n-type $Bi_2Te_3$-based material may further include Se, I, Cl, Hg, Br, Ag, Cu, or a combination thereof. In one embodiment, the binder can be ethyl cellulose. In one embodiment, the solvent is terpineol, ethanol, or a combination thereof.

As shown in FIG. 1, the thermoelectric ink is coated on a substrate to form a pattern of the thermoelectric ink 13 on the substrate 11. In one embodiment, the coating method can be screen printing, spray coating, or another enable coating method. In one embodiment, the substrate 11 can be glass, quartz, stainless steel, or another thermal resistant and substantially rigid substrate. In one embodiment, the substrate 11 is glass or another transparent substrate, which is beneficial to surveying the second surface of the pattern of the thermoelectric ink 13, the second surface of a porous thermoelectric pattern 13' (formed in the following steps), and the second surface of a polymer film (formed in subsequent steps). In one embodiment, the pattern of the thermoelectric ink 13 is formed by screen printing, and the thermoelectric powder in the thermoelectric ink will be stacked horizontally by a blade in the screen printing.

Figure 2:
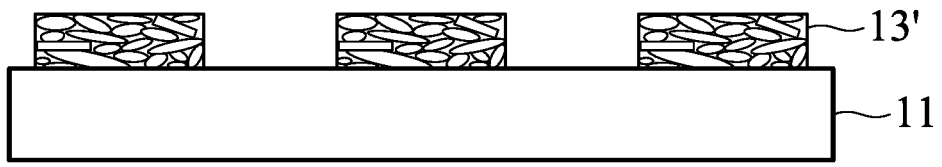

Subsequently, the pattern of the thermoelectric ink 13 was thermally treated to form a porous thermoelectric pattern 13' on the substrate 11, as shown in FIG. 2. In one embodiment, the horizontally stacked thermoelectric material in the thermoelectric ink is connected to form a continuous phase with a porous structure by the thermal treatment. In addition, a wetting angle between the thermoelectric material in the porous thermoelectric pattern 13' and a gel polymer (described below) can be fine-tuned by the thermal treatment, so that pores of the porous thermoelectric pattern 13' are easier to be filled by the gel polymer. In one embodiment, the porous thermoelectric pattern 13' has a thickness of 5 μm to 100 μm. The gel polymer (e.g. PI) may permeate into a bottom of an overly thin thermoelectric pattern and covers too much second surface of the overly thin thermoelectric pattern, thereby increasing the contact resistivity of a P/N thermoelectric series connection in subsequent steps. If the porous thermoelectric pattern 13' is too thick, a sintering necking phenomenon will occur after thermally treating the thermoelectric ink. However, the sheet-shaped thermoelectric material is inherently brittle, and the overly thick thermoelectric pattern not protected by sufficient polymer film (e.g. PI) cannot sustain a large curvature angle during the step of separating the flexible thermoelectric structure and the rigid substrate.

In one embodiment, the thermal treatment includes sequential drying, degreasing, and reduction sintering under a reducing atmosphere. In one embodiment, the drying step is performed under normal atmosphere at a temperature of 80° C. to 120° C. for a period of 8 minutes to 12 minutes. If the drying step is performed at an overly low temperature and/or for an overly short period, some solvent will not be removed to easily crack the thermoelectric pattern in the following degreasing step due to fast gasification of the solvent in the film. If the drying step is performed at an overly high temperature and/or for an overly long period, the thermoelectric pattern will be easily cracked due to fast gasification of the solvent in the film. In one embodiment, the degreasing step is performed under normal atmosphere at a temperature of 160° C. to 240° C. for a period of 24 minutes to 36 minutes. If the degreasing step is performed at an overly low temperature and/or for an overly short period, the binder in the thermoelectric pattern will not be completely removed to form residual carbon. The residual carbon is not easily removed in the following reduction sintering, which may negatively influence the sintering effect of the thermoelectric powder and the electrical properties of the porous thermoelectric pattern. If the degreasing step is performed at an overly high temperature and/or for an overly long period, the surface of the thermoelectric powder will be oxidized more due to the degreasing step is performed under the normal atmosphere. In one embodiment, the reduction sintering is performed under a reduction atmosphere (e.g. hydrogen, a mixture of hydrogen and nitrogen such as 5% $H_2$ in $N_2$, or a mixture of hydrogen and argon such as 5% $H_2$ in Ar) at a temperature of 320° C. to 480° C. for a period of 24 minutes to 36 minutes. If the reduction sintering is performed at an overly low temperature and/or for an overly short period, the sintering effect will not be sufficient and the de-oxidation on the surface of the porous thermoelectric pattern will not be complete. As a result, the porous thermoelectric pattern has poor electrical properties. If the reduction sintering is performed at an overly high temperature, the alloy content ratios of the porous thermoelectric pattern will be easily changed. If the reduction sintering is performed for an overly long period, the porous thermoelectric pattern will gradually contract, deform, or crack.

Figure 3:
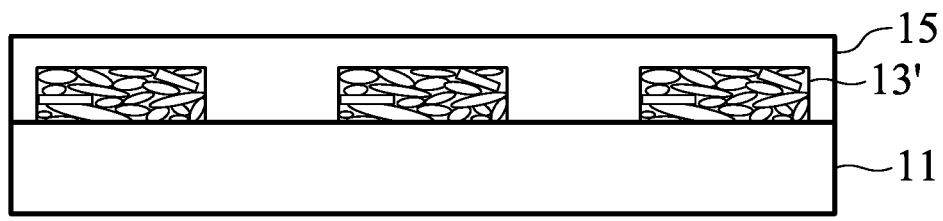

Subsequently, a gel polymer is coated on the porous thermoelectric pattern 13' and the substrate 11, and then cured to form a polymer film 15, as shown in FIG. 3. The porous thermoelectric pattern 13' has a first surface and a second surface opposite to the first surface. The polymer film 15 has a first surface and a second surface opposite to the first surface. The polymer film 15 covers a first surface of the porous thermoelectric pattern 13' and fills the pores of the porous thermoelectric pattern 13', and the second surface of the polymer film 15 is coplanar with the second surface of the porous thermoelectric pattern 13' when the flexible thermoelectric structure is not bended. Note that the polymer film 15 does not cover the second surface of the porous thermoelectric pattern 13'.

The polymer film 15 can be composed of polyimide or polyvinylidene fluoride. In one embodiment, the gel polymer includes not only the above composition, but also solvent and additives (optional) to fine-tune its properties. In one embodiment, the solvent can be N-methyl-2-pyrrolidone (NMP). For example, the gel polymer may have a solid content of 10 wt % to 30 wt %, and the gel polymer and the thermoelectric material of the porous thermoelectric pattern have a wetting angle of 15° to 45° therebetween. If the gel polymer has an overly high solid content and/or the gel polymer and the thermoelectric material have an overly large wetting angle therebetween, the gel polymer cannot easily fill the pores of the porous thermoelectric pattern. If the gel polymer has an overly low solid content and/or the gel polymer and the thermoelectric material have an overly little wetting angle therebetween, the gel polymer cannot easily cover the first surface of the porous thermoelectric pattern 13' and even cannot form a film.

In one embodiment, the gel polymer is cured by thermal treatment at a temperature of 170° C. to 250° C. for a period of 30 minutes to 2 hours. If the thermal treatment is performed at an overly high temperature and/or for an overly long period, the polymer (e.g. polyimide) will not sustain the temperature and therefore being deteriorated or brittle. As such, the polymer film is brittle and cracked or cannot be separated from the substrate. If the thermal treatment is performed at an overly low temperature and/or for an overly short period, the polymer film 15 cannot be completely cured. After the described steps, the porous thermoelectric pattern 13' and the polymer film construct a flexible thermoelectric structure 100.

Figure 4:
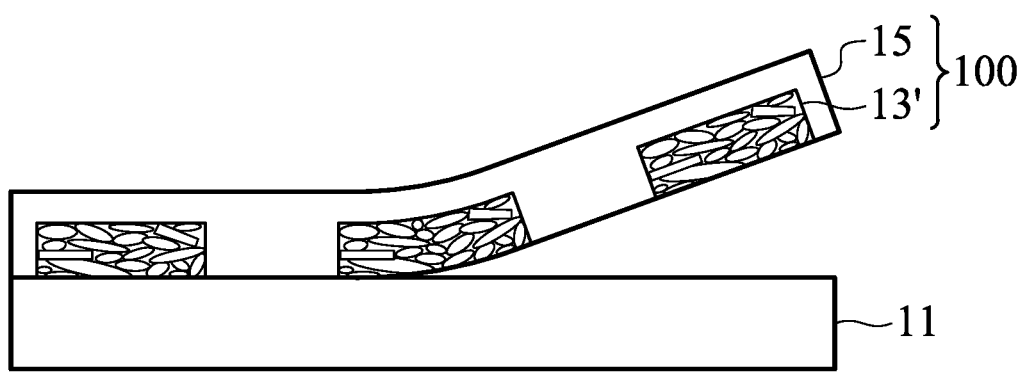
Figure 5:
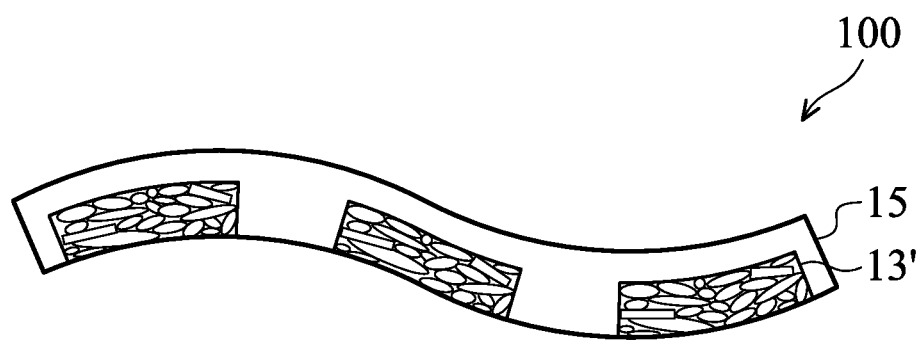

As shown in FIG. 4, the substrate 11 and the flexible thermoelectric structure 100 are subsequently separated. As shown in FIG. 5, the separated flexible thermoelectric structure 100 is the product. In one embodiment, the flexible thermoelectric structure 100 has a thickness of 10 micrometers to 150 micrometers. An overly thick flexible thermoelectric structure 100 means an overly thick polymer film (e.g. polyimide), which will not influence the thermoelectric properties of the product but increase the material cost and the device volume. An overly thin flexible thermoelectric structure 100 may lack the toughness provided by the polymer film, such that the porous thermoelectric pattern easily becomes damaged during use. In addition, an overly thin porous thermoelectric pattern has a lower thermoelectric transfer effect.

In one embodiment, the porous thermoelectric pattern in the flexible thermoelectric structure 100 is the p-type $Bi_2Te_3$-based material, and the flexible thermoelectric structure 100 has electrical conductivity of 400 S/cm to 500 S/cm, Seebeck coefficient of 200 µV/K to 210 µV/K, heat transfer coefficient of 0.3 W/mK to 0.6 W/mK, and thermoelectric figure of merit (ZT) of 0.6 to 0.8. A substrate made of the flexible thermoelectric structure 100 had a bendable radius of curvature greater than 0.5 cm. In one embodiment, the porous thermoelectric pattern in the flexible thermoelectric structure 100 is the n-type $Bi_2Te_3$-based material, and the flexible thermoelectric structure 100 has an electrical conductivity of 250 S/cm to 350 S/cm, Seebeck coefficient of −160 µV/K to −150 µV/K, heat transfer coefficient of 0.3 W/mK to 0.6 W/mK, and thermoelectric figure of merit (ZT) of 0.4 to 0.7. A substrate made of the flexible thermoelectric structure 100 had a bendable radius of curvature greater than 0.5 cm. The described flexible thermoelectric structure can be applied in power modules, such as for capturing waste heat in the steel industry, petroleum industry, cement industry, metal industry, automobile industry, incineration, hot springs, or solar energy, or utilizing the temperature difference between the power module and the environment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Example 1

Elements were stoichiometrically weighed, put into a quartz tube, vacuumed, and sealed. The elements were treated by zone melting to form a compound, and then cracked and ball milled to form p-type thermoelectric powder of $Bi_{0.5}Sb_{1.5}Te_3$ for a printing process. 40 g of the p-type thermoelectric powder, 2.5 g of the ethyl cellulose (Aqualon EC-N100) serving as a binder, and 7.5 g of terpineol serving as solvent were mixed to form a thermoelectric ink. The thermoelectric ink was printed on a glass substrate by screen printing, thereby forming a pattern of the thermoelectric ink. In the pattern of the thermoelectric ink, the thermoelectric powder was stacked horizontally. The pattern of the thermoelectric ink was then thermally treated to form a porous thermoelectric pattern. The thermal treatment included sequentially drying (at 100° C. for 10 minutes), degreasing (200° C./30 minutes), and reduction sintering under hydrogen atmosphere (at 400° C. for 30 minutes). After the thermal treatment, the horizontally stacked thermoelectric powder was connected to each other to form a continuous phase.

Gel polyimide having a solid content of 19% (prepared as disclosed in U.S. Pub. No. 2011/0155235A1) was selected, and the gel polyimide and the thermoelectric material had a wetting angle of 40°±2° therebetween (measured by sessile drop method). The gel polyimide was coated on the porous thermoelectric pattern (after the thermal treatment) and the glass substrate, in which the gel polyimide covered the porous thermoelectric pattern and filled into the pores of the porous thermoelectric pattern. The gel polyimide was then thermally treated at 210° C. for 1 hour to be cured, thereby obtaining a polyimide film. Therefore, the second surface of the polyimide film was coplanar with the second surface of the porous thermoelectric pattern, and the polyimide film and the porous thermoelectric pattern constructed a flexible thermoelectric structure. The flexible thermoelectric structure was then separated from the glass substrate. The flexible thermoelectric structure had an electrical conductivity of 450 S/cm (measured by four-point probe to obtain the resistivity), Seebeck coefficient of 208 μV/K, heat transfer coefficient of 0.45 W/mK (measured by 3-omega method), and thermoelectric figure of merit (ZT) of 0.70. A substrate made of the flexible thermoelectric structure had bendable radius of curvature greater than 0.5 cm. The Seebeck coefficient was measured as described below: the test sample of the printed material was contacted by two probes (with a distance of 5 mm therebetween), in which one probe was heated, such that the two contacts had a temperature difference (DT) of 5° C. The voltage difference (DV) of the two contacts was then measured. DV was divided by DT (DV/DT) to obtain the Seebeck coefficient.

Example 2

Example 2 was similar to Example 1, and the differences in Example 2 were that the p-type thermoelectric powder of $Bi_{0.5}Sb_{1.5}Te_3$ was replaced with n-type thermoelectric powder of $Bi_2Te_{2.7}Se_{0.3}$ and 0.12 wt % $BiI_3$, and the reduction sintering under hydrogen (at 400° C. for 30 minutes) in the thermal treatment for the pattern of the thermoelectric ink was replaced by a reduction sintering under hydrogen (at 400° C. for 15 minutes) and a sintering under nitrogen (at 400° C. for 15 minutes). The n-type thermoelectric powder of $Bi_2Te_{2.7}Se_{0.3}$ and 0.12 wt % $BiI_3$ was prepared as described below: Elements were stoichiometrically weighed, put into a quartz tube, vacuumed, and sealed. The elements were treated by zone melting to form a compound, and then cracked and ball milled to form the n-type thermoelectric powder for the printing process. In the flexible thermoelectric structure of Example 2, the polyimide filled into the pores of the porous thermoelectric pattern, and the second surface of the polyimide film was coplanar with the second surface of the porous thermoelectric pattern. The flexible thermoelectric structure had an electrical conductivity of 300 S/cm (measured by four-point probe to obtain the resistivity), Seebeck coefficient of −156 μV/K, heat transfer coefficient of 0.40 W/mK (measured by 3-omega method), and thermoelectric figure of merit (ZT) of 0.40. A substrate made of the flexible thermoelectric structure had a bendable radius of curvature greater than 0.5 cm. The Seebeck coefficient was measured as described below: the test sample of the printed material was contacted by two probes (with a distance of 5 mm therebetween), in which one probe was heated, such that the two contacts had a temperature difference (DT) of 5° C. The voltage difference (DV) of the two contacts was then measured. DV was divided by DT (DV/DT) to obtain the Seebeck coefficient.

Comparative Example

The gel polyimide in Example 1 was directly formed on the glass substrate, and then heated to be cured for forming a polyimide film. The thermoelectric ink in Example 1 was printed on the polyimide film by screen printing to form a pattern of the thermoelectric ink. The pattern of the thermoelectric ink was thermally treated to form a porous thermoelectric pattern. The thermal treatment included sequentially drying (at 100° C. for 10 minutes), degreasing (at 200° C. for 30 minutes), and reduction sintering under hydrogen (at 400° C. for 30 minutes). The porous thermoelectric pattern on the polyimide film was cracked after being bended, meaning that the structure of the porous thermoelectric pattern and the polyimide film was not flexible.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A method of manufacturing a flexible thermoelectric structure, comprising:
   forming a pattern of a thermoelectric ink on a substrate;

thermal treating the thermoelectric ink to form a porous thermoelectric pattern on the substrate, wherein the step of thermal treating the thermoelectric ink comprises:
  sequential drying, degreasing, and reduction sintering under a reducing atmosphere, in which the drying is performed under normal atmosphere at a temperature of 80° C. to 120° C. for a period of 8 minutes to 12 minutes, the degreasing is performed under normal atmosphere at a temperature of 160° C. to 240° C. for a period of 24 minutes to 36 minutes, and the reduction sintering is performed under a reduction atmosphere at a temperature of 320° C. to 480° C. for a period of 24 minutes to 36 minutes;
coating a gel polymer on the porous thermoelectric pattern and the substrate, and curing the gel polymer to form a polymer film, wherein the porous thermoelectric pattern and the polymer film construct a flexible thermoelectric structure; and
separating the substrate and the flexible thermoelectric structure,
wherein the porous thermoelectric pattern has a first surface and a second surface opposite to the first surface; and
wherein the polymer film has a first surface and a second surface opposite to the first surface;
wherein the polymer film covers the first surface of the porous thermoelectric pattern and fills pores of the porous thermoelectric pattern, and the second surface of the polymer film is coplanar with a second surface of the porous thermoelectric pattern.

2. The method as claimed in claim 1, wherein the polymer film is composed of polyimide or polyvinylidene fluoride, and the porous thermoelectric pattern is composed of $Bi_2Te_3$-based material, PbTe-based material, GeTe-based material, $Zn_4Sb_3$-based material, or $CoSb_3$-based material.

3. The method as claimed in claim 1, wherein the porous thermoelectric pattern includes a plurality of sheet-shaped thermoelectric materials stacked horizontally and connected to form a continuous phase.

4. The method as claimed in claim 3, wherein the step of forming the pattern of the thermoelectric ink on the substrate includes screen printing, and the sheet-shaped thermoelectric materials in the thermoelectric ink are stacked horizontally by a blade in the screen printing.

5. The method as claimed in claim 1, wherein the second surface of the porous thermoelectric pattern is not covered by the polymer film.

6. The method as claimed in claim 1, wherein the gel polymer and a thermoelectric material of the porous thermoelectric pattern have a wetting angle of 15° to 45° therebetween.

* * * * *